United States Patent
Tsurumi et al.

(10) Patent No.: US 6,388,496 B1
(45) Date of Patent: May 14, 2002

(54) SEMICONDUCTOR OUTPUT CIRCUIT

(75) Inventors: Hiroyuki Tsurumi, Yokohama; Toshiro Kubota, Kawasaki, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/549,512

(22) Filed: Apr. 14, 2000

(30) Foreign Application Priority Data

Apr. 15, 1999 (JP) ............................................. 11-107632

(51) Int. Cl.[7] ................................................. H03K 5/08
(52) U.S. Cl. ........................................ 327/314; 327/317
(58) Field of Search ................................. 327/112, 314, 327/320, 325, 530, 564, 565, 317, 309, 310; 361/82, 91.5, 91.7

(56) References Cited

U.S. PATENT DOCUMENTS

| | | | | |
|---|---|---|---|---|
| 4,355,344 A | * | 10/1982 | Felici et al. | 330/207 P |
| 4,691,262 A | * | 9/1987 | Chalfin | 323/315 |
| 4,712,153 A | * | 12/1987 | Marget et al. | 330/207 P |
| 5,469,095 A | * | 11/1995 | Peppiette et al. | 327/110 |
| 5,561,313 A | * | 10/1996 | Saitoh et al. | 257/173 |
| 5,627,715 A | * | 5/1997 | Brokaw | 257/547 |
| 5,684,427 A | * | 11/1997 | Stoddard et al. | 327/108 |

FOREIGN PATENT DOCUMENTS

| JP | 3-148832 | 6/1991 |
|---|---|---|
| JP | 4-217356 | 8/1992 |
| JP | 7-106513 | 4/1995 |

* cited by examiner

*Primary Examiner*—Matthew Smith
*Assistant Examiner*—Paul Dinh
(74) *Attorney, Agent, or Firm*—Oblon, Spivak, McClelland, Maier & Neustadt, P.C.

(57) ABSTRACT

The present invention relates to a semiconductor output circuit that protects a circuit including such a reverse operation as reverses the potentials of a collector and an emitter of a bipolar transistor. A cathode of a protective diode is connected to a P type side of a base-emitter PN junction of a bipolar transistor constituting a semiconductor output circuit, while an anode of the protective diode is connected to an N type side of the base-emitter PN junction. By positively operating the bipolar transistor in a reverse direction with a reverse current gain $\beta_R > 1$, a reverse voltage between a collector and an emitter of the bipolar transistor is precluded from exceeding Veco to prevent the transistor from being broken down due to its reverse operation. In addition, by connecting the anode of the protective diode to a P type side of a base-collector PN junction of the bipolar transistor constituting the semiconductor output circuit, while connecting the cathode of the protective diode to an N type side of the base-collector junction, Veco is increased to a higher level within the entire circuit to prevent the bipolar transistor from being broken down due to its reverse operation.

10 Claims, 9 Drawing Sheets

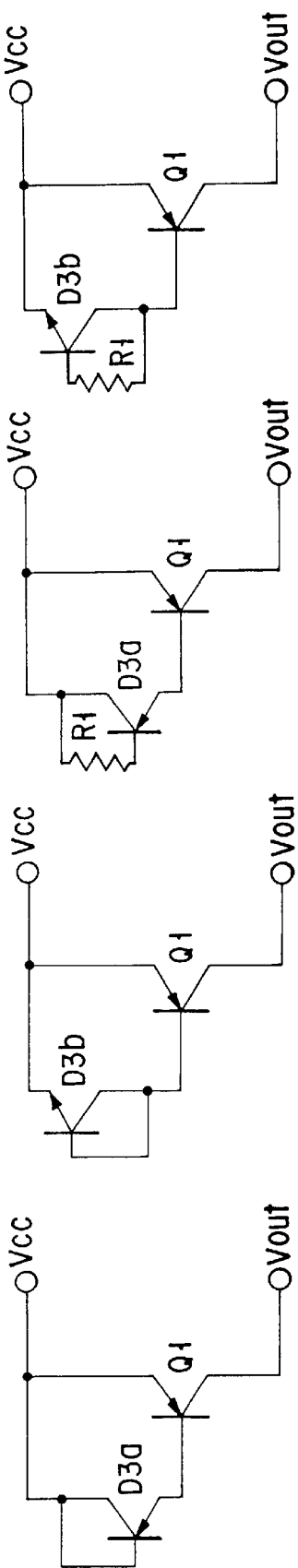
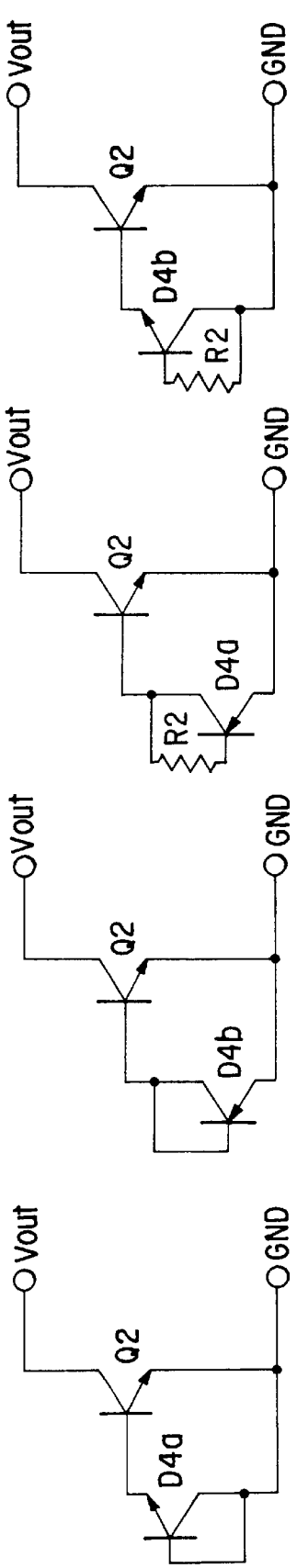

SEMICONDUCTOR OUTPUT CIRCUIT

CROSS-REFERENCE TO RELATED APPLICATIONS

This application is based upon and claims the benefit of priority from the prior Japanese Patent Application No. 11-107632, filed Apr. 15, 1999, the entire contents of which are incorporated herein by reference.

BACKGROUND OF THE INVENTION

The present invention relates to a semiconductor output circuit that can protect such a circuit as reverses the potentials of a collector and an emitter of a bipolar transistor.

A problem of an output circuit for driving an inductive load is that it is often damaged by a counter electromotive force from the inductive load.

FIG. 1 shows an example of a conventional output circuit. This output circuit 1 is comprised of a driving circuit 2, and a push-pull circuit consisting of a PNP transistor Q1 and an NPN transistor Q2. An output Vout of the output circuit 1 is connected to one of the terminals of an inductive load 3. As means for preventing an output section from being broken down by a counter electromotive force from the inductive load 3, a technique is known which connects protective diodes D1, D2 in parallel to the transistors Q1, Q2.

In the conventional output circuit, the diodes D1, D2 are added outside the semiconductor chip on which the output circuit is formed. Therefore, the total device size becomes very large. An object of the present invention is to integrate these protective diodes D1, D2 on the semiconductor chip to reduce the total device size.

Such a technique as shown in FIG. 1 allows the diodes D1, D2 to absorb currents $I_{ZH}$, $I_{ZL}$ generated by a counter electromotive force from the inductive load 3 to preclude a voltage at the output terminal Vout of the power output circuit 1 from exceeding withstand voltages of the transistors Q1, Q2, thereby preventing breakdown of the transistors Q1, Q2.

The withstand voltages of the bipolar transistors Q1, Q2 constituting the push-pull circuit include collector-emitter withstand voltages Vceo1, Vceo2 for a forward operations of the Q1, Q2 and emitter-collector withstand voltages Veco1, Veco2 for reverse operations involving the reversal of voltages at the collector and emitter of the transistor.

As described above, when a counter electromotive force from the inductive load 3 increases the output terminal voltage Vout of the output circuit 1 beyond a power source voltage Vcc, the voltages at the collector and emitter of the PNP transistor Q1 are reversed. Then, when the potential difference exceeds Veco1, the transistor Q1 is broken down. In addition, if the output terminal voltage Vout of the output circuit 1 decreases below the ground, the voltages at the collector and emitter of the transistor Q2 are reversed. Then, if the potential difference exceeds Veco2, the transistor Q2 is broken down.

To sufficiently increase the values of the withstand voltages Veco1, Veco2 for reverse operations, impurities in base and emitter regions of the transistors Q1, Q2 must be diffused deeply for a low impurity concentration. This disadvantageously leads to an increased device size.

However, the recent demand for miniaturization of the device area has resulted in a tendency to reduce the withstand voltages Veco1, Veco2 for reverse operations, so that the protective diodes D1, D2 must have a diminished series resistance in order to improve their protective effects. To lessen the series resistance, larger devices must be used. Consequently, the size of the diodes D1, D2 becomes substantially equal to that of the transistors Q1, Q2, which constitute the output section, thereby hindering the size reduction of the output circuit 1.

Next, the structures of a vertical NPN transistor and a vertical PNP transistor will be described with reference to FIGS. 2A and 2B. FIG. 2A is a sectional view of a vertical NPN transistor fabricated using a miniaturized process. An N type epitaxial layer 13 is grown on a main surface of a P type semiconductor substrate 11 such as silicon, and a high-concentration buried $N^+$ impurity diffused region ($N^+BL$) 12 (hereafter referred to as a "buried region") is formed between the semiconductor substrate 11 and the N type epitaxial layer 13.

An NPN transistor is formed on the buried region 12. A device isolation region is formed in such a manner as to surround the NPN transistor. The device isolation region is comprised of a high-concentration $P^+$ impurity diffused region ($IsoP^+$) formed in the N type epitaxial layer 13, and a high-concentration $P^+$ impurity diffused region ($P^+BL$) connected to the $P^+$ impurity diffused region 14 and extending to an interior of the semiconductor substrate 11. A P type base region 16 is formed in a device region on a surface of the N type epitaxial layer 13, the device region being surrounded by the device isolation region.

The P type base region 16 has a depth, for example, of 0.6 $\mu$m from its surface. An $N^+$ emitter region 17 is formed in the P type base region 16. The $N^+$ emitter region 17 has a depth, for example, of 0.3 $\mu$m from its surface. An $N^+$ high-concentration collector region ($DeepN^+$) 18 is formed in a surface region of the N type epitaxial layer 13 at a predetermined distance from the base region 16 so as to connect to the buried region 12. A base terminal (B) is formed in the P type base region 16, an emitter terminal (E) is formed in the $N^+$ emitter region 17, and a collector terminal (c) is formed in the $N^+$ high-concentration collector region 18, respectively, with an $N^+$ contact region 19 being interposed between the $N^+$ high-concentration collector region 18 and the collector terminal C.

FIG. 2B is a sectional view of a vertical PNP transistor formed using the miniaturized process. The same components as in FIG. 2A carry the same reference numerals and detailed description thereof is omitted. A P type collector region 20, an N type base region 21, and a $P^+$ emitter region 22 are formed in the N type epitaxial layer 13, and a collector terminal (C), a base terminal (B), and an emitter terminal (E) are formed in the P type collector region 20, the N type base region 21, and the $P^+$ emitter region 22, respectively.

Based on correspondence to the sectional structure of the vertical NPN transistor shown in FIG. 2A, a N type buried region is formed under the P type collector region 20, and at the same time a structure connecting to the N type buried region is formed which corresponds to 18, 19 in FIG. 2A. These components, however, are not directly relate to the present invention and have thus been omitted.

The value of an emitter-collector withstand voltage Veco of a bipolar transistor is determined by means of a reverse biased emitter junction, that is, when a leakage current arising from avalanche breakdown of a junction formed in a boundary between an emitter and a base regions of the bipolar transistor is conveyed to an interior of the base region, where it becomes an effective base current.

Accordingly, even in a base open state, an amplifying effect substantially equal to the flow of an effective base current occurs in the bipolar transistor, thereby reducing the value Veco below the breakdown voltage of the single reverse biased emitter junction (collector open emitter-base breakdown voltage Vebo), if the reverse current gain $\beta_R$ of the bipolar transistor is larger than 1.

The meaning of the reverse current gain is as follows.

The ratio of the collector current to the base current through the bipolar transistor is a quantity generally called a current gain $\beta$. However, in a circuit involving reversal of the potentials of a collector and emitter of a bipolar transistor (this is hereafter referred to as a reverse operation), the current gain $\beta$ of the usual forward biased operation is changed to the current gain $\beta_R$ of the reverse operation.

The current gain $\beta_R$ in present specification is defined as the current gain for the reverse operation of the bipolar transistor.

The vertical NPN transistor shown in FIG. 2A and which is fabricated using the miniaturized process has a shallow emitter junction and an emitter region formed so as to have a high impurity concentration, whereby the emitter junction is subjected to a large amount of leakage current. In the base open state, the emitter-collector withstand voltage Veco has a low value of about 3V.

FIG. 3A shows a circuit for measuring Veco. This measuring circuit is configured to connect an ammeter between a collector of a base-open NPN transistor and the ground and to connect a power source 24 to an emitter of the transistor 23. Since the emitter of the NPN transistor is connected to a positive side of the power source 24, the voltage is principally applied to a reverse biased emitter junction.

An example of a measured current voltage characteristic is shown in FIG. 3B. This figure shows that the current rises rapidly with an applied voltage of 3V and that the emitter-collector breakdown voltage Veco has a low value of about 3V.

The value Veco of the vertical NPN transistor shown in FIG. 2A and which is fabricated using the miniaturized process has been described, but substantially similar results are obtained with the vertical PNP transistor shown in FIG. 2B and which is fabricated using the miniaturized process.

As described above, in a circuit including the reverse operation, the bipolar transistor is broken down at a very small value of Veco under a base-open or near-base-open condition. Therefore, measures for protecting such a circuit are required.

Although there have been circuits in which a bipolar transistor operates in a reverse direction under specific conditions, for example, as shown in FIG. 1, many recent circuits include a bipolar transistor that operates in the reverse direction under normal operation conditions.

For such a circuit, the reverse withstand voltage of the bipolar transistor, that is, the emitter-collector withstand voltage Veco is desirably increased to prevent breakdown. To sufficiently increase the withstand voltage, impurities must be deeply diffused in a base and an emitter of the transistor for a low concentration. This results in an increased device size to hinder chip size reduction.

The reversal of the potentials of a collector and an emitter of a bipolar transistor may occur, for example, in a car audio amplifier IC due to a counter electromotive force from an inductance component of a speaker wire acting as a load. In addition, in a large-signal operation of an power amplifier circuit such as shown in FIG. 13, the output potential may increase above that of an intermediate power source line or decrease below that of the intermediate power source line. In such a case, the potentials of a collector and an emitter of an output transistor are reversed.

In addition, in order to meet demands for protection against an abnormal condition of a semiconductor output circuit (for example, a user's inappropriate operation), ground open output-ground shorting tests and Vcc open output-Vcc shorting tests on a breakdown mode specific to car ICs are being conducted.

A ground open output-ground shorting test for an amplifier IC comprising a push-pull type output circuit will be explained with reference to FIG. 4A.

According to the ground open output-ground shorting test, as shown in FIG. 4A, for an amplifier IC 28 which comprises an NPN transistor 26 and a PNP transistor 27 connected together in a push-pull manner, an output terminal of the amplifier IC 28 is shorted to a ground terminal of a power source 29 with a ground terminal of the amplifier IC removed from the ground terminal of the power source 29, as shown in FIG. 4A.

The moment the ground open output-ground shorting test is started, a large capacitor 30 is not charged which is located between the power source and the ground and which is externally connected to the amplifier IC 28. Accordingly, the emitter potential of the NPN transistor 26 is equal to the potential Vcc of the power source 29 while the collector potential of the NPN transistor 26 is equal to the ground potential of the power source 29, thereby reversing the potentials of the emitter and the collector.

At this point, if the emitter-collector withstand voltage Veco has a small value, the NPN transistor is broken down. Likewise, in the Vcc open output-Vcc shorting test shown in FIG. 4B, the potentials of the emitter and collector of the PNP transistor 27 are reversed, so that the PNP transistor 27 is broken down if the emitter-collector withstand voltage Veco has a small value. By shipping amplifier ICs that have passed these tests, users' inappropriate operations can be dealt with.

As described above, the emitter-collector withstand voltage Veco has a smaller value than the emitter-base withstand voltage Vebo because a leakage current from a reverse biased emitter-base junction of a transistor is transported to an interior of a base thereof, where it becomes a base current and because avalanche breakdown, a source of the leakage current, is amplified by the transistor.

To sufficiently increase the value Veco, the emitter-base withstand voltage (withstand voltage of an emitter junction) must be raised by carrying out deep base-emitter diffusion of low impurity concentration or lessening the amplifying effect of a reverse operation of the transistor.

As described above, however, due to the ever decreasing size of devices, the recent tendency is to carry out shallow base-emitter diffusion of high impurity concentration, thereby gradually diminishing the emitter-collector withstand voltage Veco of bipolar transistors. Thus, it has gradually become difficult to protect semiconductor output circuits including such a reverse operation as reverses the potentials of a collector and an emitter of a bipolar transistor fabricated using the miniaturized process.

BRIEF SUMMARY OF THE INVENTION

As described above, the conventional semiconductor output circuits has the problem that it is difficult to protect bipolar transistors including such a reverse operation as reverses the potentials of a collector and an emitter thereof.

The present invention is adapted to solve this problem, and it is an object thereof to provide a semiconductor output circuit that can increase the emitter-collector withstand voltage without the needs for deep base-emitter diffusion of low impurity concentration.

That is, a first additional circuit comprising a diode according to the present invention is characterized in that it is constructed by connecting a protective diode between a base and an emitter of a bipolar transistor constituting a semiconductor output circuit and in that a cathode of the protective diode is connected to a P type side of a base-emitter PN junction, while an anode of the protective diode is connected to an N type side of the base-emitter PN junction.

The anode and cathode of the diode are defined as electrodes wherein a high forward current flows through the diode when the potential of the anode is increased above that of the cathode.

Thus, if the first additional circuit comprising the protective diode is provided between the base and emitter of the bipolar transistor and a current gain $\beta_R$ of the reverse operation of the bipolar transistor (collector current/base current) is larger than 1, then during the reverse operation of this bipolar transistor, a base current flowing through the first additional circuit operates the bipolar transistor on an ON side. Thus, the voltage between the emitter and collector of the bipolar transistor decreases.

In addition, a second additional circuit comprising a diode according to the present invention is characterized in that it is constructed by connecting a protective diode between a base and a collector of a bipolar transistor constituting an output circuit and in that an anode of the protective diode is connected to a P type side of a base-collector PN junction while a cathode of the protective diode is connected to an N type side of the base-collector PN junction.

If the second additional circuit comprising the protective diode is provided between the base and collector of the bipolar transistor in the above manner, the value Vceo during a reverse operation of the bipolar transistor can be increased without the needs for deep base-emitter diffusion of low impurity concentration. Consequently, in particular, a semiconductor output circuit including a reverse operation in a base-open or near-base-open state can be effectively prevented from being broken down.

Specifically, the present invention provides a semiconductor output circuit comprising a push-pull circuit formed of a first bipolar transistor and a second bipolar transistor, and a protective diode configured to protect a bipolar transistor of at least any one of the first and second bipolar transistors, wherein the protective diode protects the bipolar transistor from a reverse operation of reversing a polarity of a difference in potential between a collector and an emitter thereof in comparison to a normal bias state, the bipolar transistor has a value of a reverse current gain $\beta_R$ larger than 1, and a cathode of the protective diode is connected to a P type side of a base-emitter PN junction of the bipolar transistor while an anode of the protective diode is connected to an N type side of the base-emitter PN junction of the bipolar transistor.

In addition, the present invention provides a semiconductor output circuit comprising a first power source line, a second power source line having a lower voltage than the first power source line, a push-pull circuit formed between the first and second power source lines and comprising a PNP and an NPN transistors, and a first and second protective diodes configured to protect the PNP and NPN transistors respectively, wherein the first and second protective diodes protect the PNP and NPN transistors from a reverse operation of reversing a polarity of a difference in potential between a collector and an emitter thereof in comparison to a normal bias state, and each of the PNP and NPN transistors has a value of a reverse current gain $\beta_R$ larger than 1, and wherein the emitter of the PNP transistor is connected to the first power source line, the emitter of the NPN transistor is connected to the second power source line, the collector of the PNP transistor and the collector of the NPN transistor are connected together to constitute an output node of the push-pull circuit, a base of the PNP transistor is connected to an anode of the first protective diode, a cathode of the first protective diode is connected to the first power source line, a base of the NPN transistor is connected to a cathode of the second protective diode, and an anode of the second protective diode is connected to the second power source line.

In addition, the present invention provides a semiconductor output circuit comprising a bipolar transistor, a load circuit of the bipolar transistor, a circuit comprised of an active element or an impedance element a terminal of the circuit being connected to a connecting portion of the bipolar transistor and the load circuit, and a protective diode configured to protect the bipolar transistor, wherein the circuit comprised of the active element or the impedance element causes the reverse operation of the bipolar transistor reversing a polarity of a difference in potential between a collector and an emitter thereof in comparison to a normal bias state, the protective diode protects the bipolar transistor from reverse operation, and an anode of the protective diode is connected to a P type side of a base-collector PN junction of the bipolar transistor while a cathode of the protective diode is connected to an N type side of the base-collector PN junction of the bipolar transistor.

In addition, the present invention provides a semiconductor output circuit comprising a first power source line, a second power source line having a lower voltage than the first power source line, an intermediate power source line having a voltage lower than that of the first power source line and higher than that of the second power source line, an output node of an NPN transistor to which a collector of the NPN transistor and one of the terminals of a load circuit are connected, a circuit comprised of an active element or an impedance element having one of its terminals connected to the output node, and a protective diode configured to protect the NPN transistor, wherein the circuit comprised of the active element or the impedance element causes a reverse operation of the NPN transistor reversing a polarity of a difference in potential between a collector and an emitter thereof in comparison to a normal bias state, and the protective diode protects the NPN transistor from the reverse operation, and wherein an emitter of the NPN transistor is connected to the intermediate power source line, the other terminal of the load circuit is connected to the first power source line, the other terminal of the circuit comprised of the active element or the impedance element is connected to the second power source line, a cathode of the protective diode is connected to the collector of the NPN transistor, and an anode of the protective diode is connected to the base of the NPN transistor.

In addition, the present invention provides a semiconductor output circuit comprising a first power source line, a second power source line having a lower voltage than the first power source line, an intermediate power source line having a voltage lower than that of the first power source line and higher than that of the second power source line, an output node of an PNP transistor to which a collector of the PNP transistor and one of the terminals of a load circuit are connected, a circuit comprised of an active element or an impedance element having one of its terminals connected to the output node, and a protective diode configured to protect the PNP transistor, wherein the circuit comprised of the active element or the impedance element causes a reverse operation of the PNP transistor reversing a polarity of a difference in potential between a collector and an emitter thereof in comparison to a normal bias state, and the protective diode protects the PNP transistor from the reverse operation, and wherein an emitter of the PNP transistor is connected to the intermediate power source line, the other terminal of the load circuit is connected to the second power source line, the other terminal of the circuit comprised of the active element or the impedance element is connected to the first power source line, a cathode of the protective diode is connected to a base of the PNP transistor, and an anode of the protective diode is connected to the collector of the PNP transistor.

Additional objects and advantages of the invention will be set forth in the description which follows, and in part will be obvious from the description, or may learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 6A, 6B, 6C, 6D, 7A, 7B, 7C and 7D are diagrams showing a circuit configuration for PN junction devices according to a second embodiment;

DETAILED DESCRIPTION OF THE INVENTION

Embodiments of the present invention will be described below with reference to the drawings.

A first embodiment will be explained with reference to FIG. 5. In the first embodiment, a push-pull semiconductor output circuit is described in which PN junction devices are each connected, as a protective circuit for protection against reverse operations, between a base and an emitter of a corresponding one of bipolar transistors constituting a push-pull semiconductor output circuit, wherein the PN junction device has a junction direction opposite to that of the PN junction between the base and emitter of the bipolar transistor.

Figure 5:
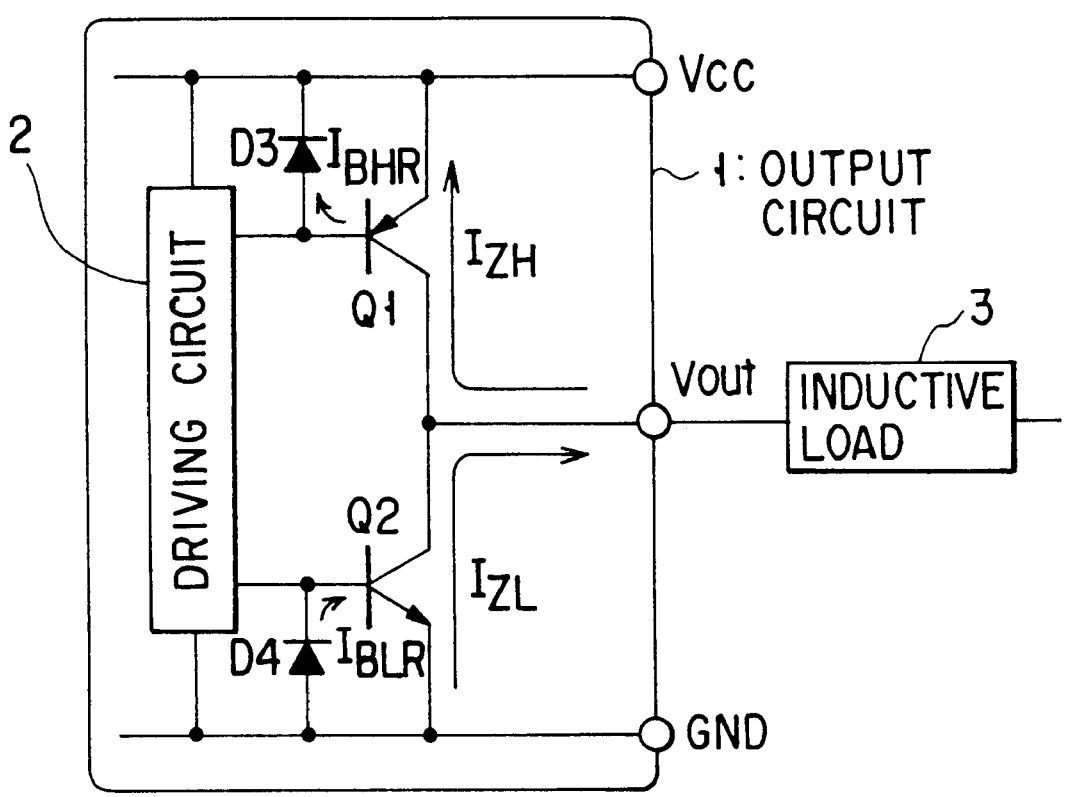
FIG. 5 is a diagram showing a push-pull semiconductor output circuit with an inductive load according to a first embodiment connected thereto.

In the push-pull semiconductor output circuit 1 shown in FIG. 5, if a counter electromotive force from an inductive load 3 increases the potential Vout of an output terminal above Vcc and up to a voltage sufficient to be forward biasing a collector-base junction of a PNP transistor Q1 and a protective diode D3 together, then the collector and emitter of the PNP transistor Q1 have their potentials reversed to cause the PNP transistor Q1 to operate in a reverse direction.

Then, part of a current $I_{ZH}$ supplied by the counter electromotive force from the inductive load 3 flows to a Vcc power source line via the collector junction of the PNP transistor Q1 operating in a forward direction and the protective diode D3 operating in the forward direction, a base current $I_{BHR}$ flows through the PNP transistor Q1, in which the collector and the emitter have their potentials reversed, thereby causing the PNP transistor Q1 to operate on an "ON" side.

When part of the current $I_{ZH}$ supplied by the counter electromotive force from the inductive load 3 flows as the base current $I_{BHR}$ of the PNP transistor Q1 in the above manner, the PNP transistor can absorb the $I_{ZH}$ as a collector current.

If a reverse current gain of the PNP transistor Q1 is denoted by $\beta_{R1}$, then $\beta_{R1}=I_{ZH}/I_{BHR}$. That is, $\beta_{R1}$ is a quantity indicating a ratio at which the current $I_{ZH}$ supplied by the counter electromotive force from the inductive load 3 is divided into the PNP transistor Q1 and the protective diode D3. If $\beta_{R1}>1$, most of the current $I_{ZH}$ is absorbed by the PNP transistor Q1 itself.

The bipolar transistor typically has a very small $\beta_{R1}$ value ($\beta_{R1}<1$) during a reverse operation. If, however, the bipolar transistor is designed to have a $\beta_{R1}$ value of about several tens during such an operation, then most of the current $I_{ZH}$ can be absorbed by the PNP transistor Q1 itself to prevent the output terminal potential Vout from increasing above an emitter-collector withstand voltage Veco1 of Q1, thereby allowing the transistor Q1 to protect itself.

Likewise, when the counter electromotive force from the inductive load 3 reduces the output terminal potential Vout of the push-pull semiconductor output circuit 1 below the ground and down to a voltage sufficient to be forward biasing a collector-base junction of an NPN transistor Q2 and a protective diode D4 together, then the NPN transistor Q2 operates in the reverse direction in which the potentials of its collector and emitter are reversed. Then, a base current $I_{BLR}$ flowing through the diode D4 enables a current $I_{ZL}$ supplied by the counter electromotive force from the inductive load 3 to flow to Q2. As a result, the output terminal potential Vout can be prevented from increasing above an emitter-collector withstand voltage Veco2 of Q2, thereby allowing the transistor Q2 to protect itself.

If the reverse current gains $\beta_{R1}$, $\beta_{R2}$ of the transistors Q1, Q2 operating in the reverse direction are smaller than 1, $I_{ZH}$ and $I_{ZL}$ mostly flow toward the protective diodes D3, D4, respectively, which are added as protective circuits. Then, the protective effects of the protective diodes D3, D4 is provided by clamping a reverse voltage across the emitter-base junction of the transistors Q1, Q2 to a forward clamping voltage of the protective diodes D3, D4.

Since, however, the forward clamping voltage at the diode normally increases linearly with the value of the series resistance, the junction area of the protective diodes D3, D4 must be enlarged in order to reduce this voltage. As a result, the size of the protective diodes D3, D4 becomes almost the same as that of Q3, Q4 to hinder miniaturization of the semiconductor output circuit. Thus, to allow the miniature protective diodes D1, D2 explained in the first embodiment to provide significant protective effects, the values of the reverse current gains $\beta_{R1}$ and $\beta_{R2}$ of the PNP and NPN transistors constituting the push-pull semiconductor output circuit must be larger than 1.

The transistors Q1, Q2 used for the semiconductor output circuit are typically devices that are large in area and that have small series resistance in the base-emitter and base-collector junctions, so that they can allow the $I_{ZH}$, $I_{ZL}$ generated by the counter electromotive force from the inductive load to flow is therethrough. In addition, since currents $I_{ZH}/\beta_{R1}$ $I_{ZL}/\beta_{R2}$ determined by the reverse current gains $\beta_{R1}$, $\beta_{R2}$ of the transistors Q1, Q2 flow through the protective diodes D3, D4, respectively, the chip size of the semiconductor output circuit 1 can be reduced by using the protective diodes D3, D4 relatively smaller than the transistors Q1, Q2 in area.

In addition, according to the first embodiment of the present invention, by using the protective diodes D3, D4 relatively small in area to positively allow the transistors Q1, Q2 to operate in the reverse direction, the output terminal potential Vout of the semiconductor output circuit 1 can be prevented from increasing above the withstand voltage Veco of the transistors Q1, Q2 due to the counter electromotive force from the inductive load 3, thereby avoiding breakdown of the transistors Q1, Q2.

In addition, the first embodiment has been described the case where the push-pull circuit has a complementary type formed by using transistors Q1 and Q2 of PNP and NPN types. The transistors Q1 and Q2, however, are not necessarily limited to the PNP and NPN types.

Generally, the push-pull circuit may be formed by using a first and a second bipolar transistors of any type, and similar protective effect is obtained by using the protective diode connected between the base-emitter of any one of the first and second bipolar transistors, where the cathode of the protective diode is connected to a P type side of a base-emitter PN junction of the bipolar transistor while a anode of the protective diode is connected to an N type side of the base-emitter PN junction of the bipolar transistor.

Next, a second embodiment will be described with reference to FIGS. 6A, 6B, 6C, 6D, 7A, 7B, 7C and 7D. In the second embodiment, a variation of the protective diodes D3, D4 described in the first embodiment is explained.

The first embodiment has been described in conjunction with the case where the PN junctions are each connected, as the protective diodes D3, D4 for protection against reverse operations of the transistors Q1, Q2, between the base and emitter of a corresponding one of the transistors Q1, Q2 constituting the push-pull semiconductor power output circuit, wherein each PN junction is connected in the reverse direction relative to the PN junction between the base and emitter of the transistor.

The protective diodes D3, D4 for protection against reverse operations, however, are not necessarily limited to two-terminal diodes. Three-terminal bipolar transistors may be operated as two-terminal devices by diode-connecting them as shown in FIGS. 6A, 6B, 6C, 6D, 7A, 7B, 7C and 7D.

As shown in FIG. 6A, as a protective circuit for the PNP transistor Q1 operating in the reverse direction, a diode-connected PNP transistor D3a that is shorted between its base and collector can be used as the protective diode D3. In this case, an emitter junction of the diode-connected PNP transistor operates as the protective diode D3. In FIG. 6A, the direction of the emitter junction is reverse to that of the PN junction between the base and emitter of the transistor Q1.

In FIG. 6B, as a protective circuit for the PNP transistor Q1 operating in the reverse direction, a diode-connected NPN transistor D3b that is shorted between its base and collector is used as the protective diode D3. As shown in FIG. 6B, the direction of an emitter junction of the diode-connected NPN transistor is reverse to that of the PN junction between the base and emitter of the transistor Q1.

In FIG. 7A, as a protective circuit for the NPN transistor Q2 operating in the reverse direction, a diode-connected NPN transistor D4a that is shorted between its base and collector is used as the protective diode D4. As shown in FIG. 7A, the direction of an emitter junction of the diode-connected NPN transistor is reverse to that of the PN junction between the base and emitter of the transistor Q2.

In FIG. 7B, as a protective circuit for the NPN transistor Q2 operating in the reverse direction, a diode-connected PNP transistor D4b that is shorted between its base and collector is used as the protective diode D4. As shown in FIG. 7B, the direction of an emitter junction of the diode-connected NPN transistor is reverse to that of the PN junction between the base and emitter of the transistor Q2.

FIGS. 6A, 6B, 7A and 7B have been described in conjunction with the case where the bipolar transistor is shorted between its base and collector for diode connection so that the PN junction between the base and emitter of the bipolar transistor is used as the protective diode. The bipolar transistor, however, may be shorted between its base and emitter for diode connection so that the PN junction between its base and collector is possibly used as the protective diode.

In addition resistors R1, R2 may be connected between the base-collector of the diode-connected bipolar transistors as shown in FIGS. 6C, 6D, 7C, and 7D. The protective resistors R1, R2 are used for protecting the diode-connected bipolar transistors D3a, D3b, D4a and D4b.

Assuming the forward current gain of D3a, D3b, D4a and D4b as $\beta$, the reverse current gain of A1 and A2 as $\beta_R$, and the resistance of the resistors R1, R2 as R, the voltage drop by R is described as $I_{ZH} \cdot R/\beta \cdot \beta_R$, which is so small that the initial object of these diode-connected bipolar transistors D3a, D3b, D4a and D4b to protect the bipolar transistors Q1, Q2 from reverse operation is maintained.

In addition, the first embodiment has been described in conjunction with the connections of the protective diodes D3, D4 each consisting of the PN junction device operating in the reverse direction relative to the PN junction between the base and emitter of the corresponding one of the transistors Q1, Q2, the connections being made to protect the transistors Q1, Q2 from breakdown during a reverse operation. The protective diodes, however, are not necessarily limited to the PN junction devices consisting of the same semiconductor material as the transistors Q1, Q2.

For example, the PN junction elements may consist of a semiconductor material different from that of the transistors Q1, Q2. In addition, the protective diodes may be Schottky type diodes.

In this case, connections of the protective diodes consisting of Schottky type contacts are achieved by connecting a cathode (semiconductor side) of each of the diodes to a P type side of the PN junction between the base and emitter of the corresponding one of the transistors Q1, Q2 while connecting an anode (metal electrode side) of this diode to an N type side of the PN junction between the base and emitter of this transistor Q1, Q2.

The first and second embodiments have been described in conjunction with the case where $\beta_{R1} > 1$ is used to positively operate the bipolar transistor in the reverse direction so that the reverse voltage between its collector and emitter does not exceed Veco. That is, these embodiments have been explained in conjunction with the means for preventing, during a reverse operation, breakdown of the bipolar transistors constituting the semiconductor output circuit, by connecting the protective diode between the base and emitter of each of the bipolar transistors, connecting the anode of the protective diode to the N type side of the PN junction between the base and emitter of the transistor, and connecting the cathode of the protective diode to the P type side of the PN junction.

In contrast, in the following embodiments, means will be described which avoids breakdown of the bipolar transistor by increasing the reverse withstand voltage Veco of the bipolar transistor up to a higher level by connecting a protective diode. That is, means will be explained which prevents, during a reverse operation, breakdown of the bipolar transistors constituting the semiconductor output circuit, by connecting the protective diode between the base and collector of each of the bipolar transistors, connecting the anode of the protective diode to the P type side of the PN junction between the base and collector of the transistor, and connecting the cathode of the protective diode to the N type side of the PN junction.

Next, a third embodiment will be described with reference to FIGS. 8A, 8B and 8C.

Figure 1:
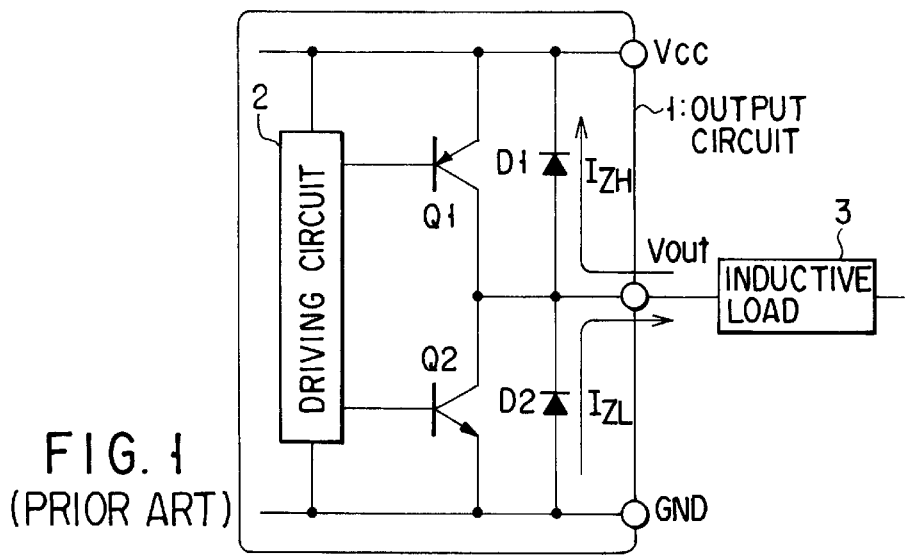
FIG. 1 is a diagram showing a conventional push-pull semiconductor output circuit with an inductive load connected thereto.
Figure 2A:
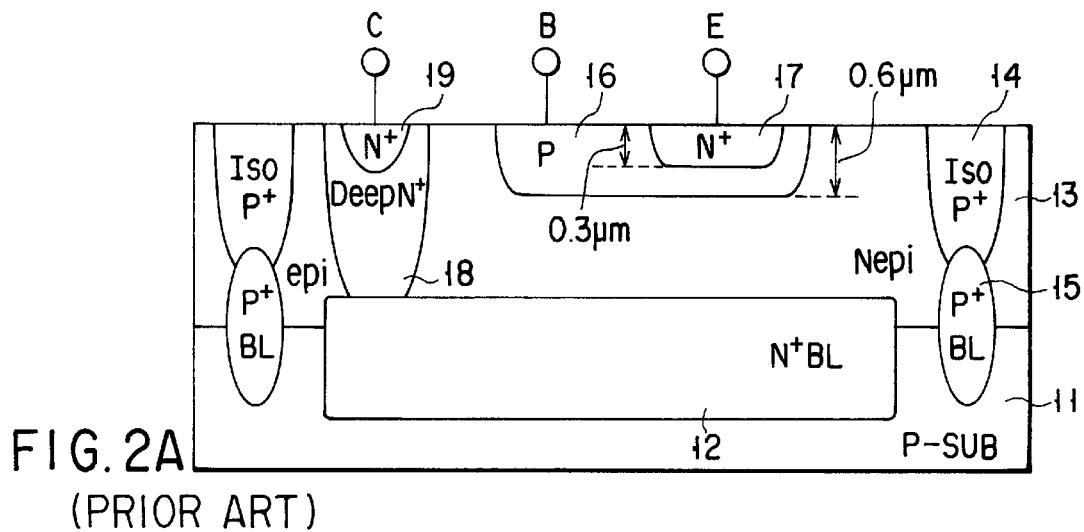
FIG. 2A is a diagram showing the sectional structure of a conventional vertical NPN transistor formed using the miniaturized process.
Figure 8A:
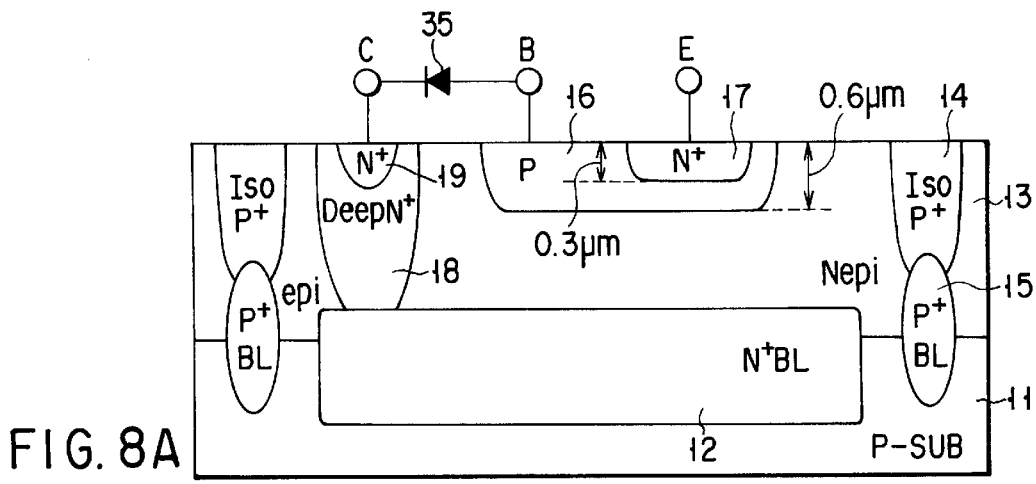
FIGS. 8A, 8B and 8C are diagrams showing the sectional structure of a vertical NPN transistor, a method for connecting the transistor to a diode, a Veco measuring circuit, and results of measurements carried out by the Veco measuring circuit according to a third embodiment.

FIG. 8A is a diagram showing the sectional structure of a vertical NPN transistor constituting a semiconductor output circuit, and a connection method for the protective diode in the third embodiment. The sectional structure of the vertical NPN transistor is similar to that described above with reference to FIG. 2A. Thus, the same components have the same reference numerals and description thereof is omitted.

According to the third embodiment shown in FIG. 8A, a PN junction device constituting a protective diode is connected to the vertical NPN transistor in the same direction as a base-collector PN junction of the transistor. That is, an anode of a protective diode 35 (a P side of the PN junction diode) is connected to a P type base region 16 of the vertical NPN transistor, while a cathode of the protective diode 35 (an N side of the PN junction diode) is connected to an $N^+$ collector contact region 19 of the vertical NPN transistor.

Figure 3A:
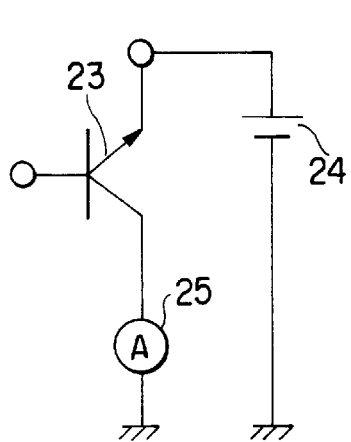
FIG. 3A is a diagram showing a Veco measuring circuit of a bipolar transistor.
Figure 3B:
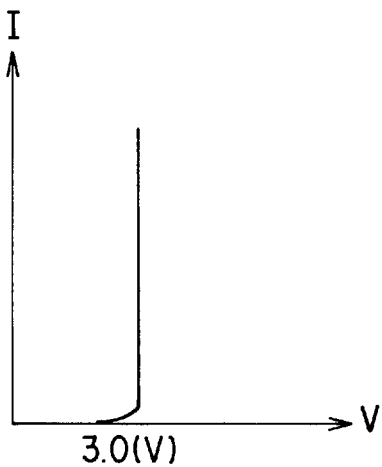
FIG. 3B is a diagram showing a result of the Veco measurement of a bipolar transistor.
Figure 8B:
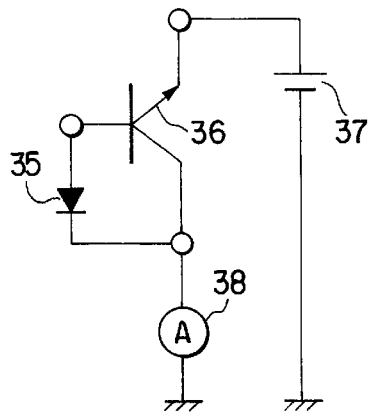
Figure 8C:
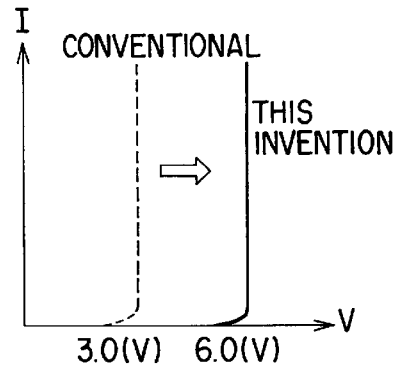

FIG. 8B shows a withstand voltage measuring circuit of the reversely connected vertical NPN transistor with the protective diode 35 in FIG. 8A. This withstand voltage measuring circuit is similar to the Veco measuring circuit shown in FIG. 3A except that the protective diode 35 is connected between a base and a collector of an NPN transistor 36. FIG. 8C shows, with solid lines, results of measurements for the presence of the protective diode 35 according to the present invention, while showing, with broken lines, results of measurements for the absence of the protective diode 35 according to the prior art. The broken lines show the results of measurements in FIG. 3B again.

As seen from the figures, by connecting the protective diodes between the base and collector of the NPN transistor 36, the withstand voltage of the vertical NPN transistor in the reverse connection can be raised from 3V to 6V.

Figure 2B:
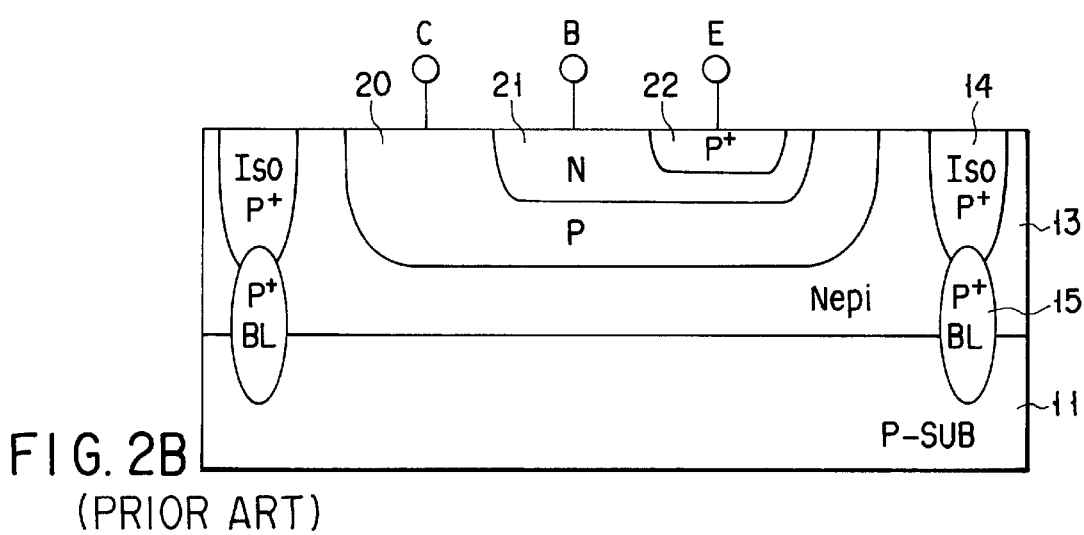
FIG. 2B is a diagram showing the sectional structure of a conventional vertical PNP transistor formed using the miniaturized process.
Figure 9:
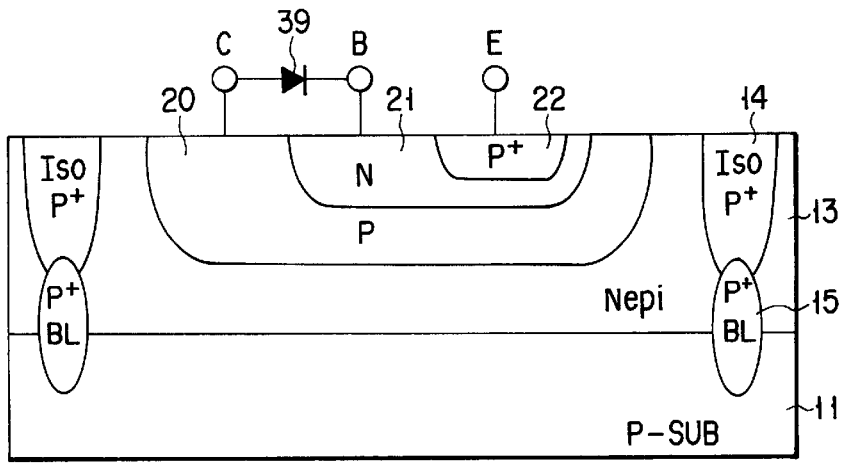
FIGS. 9, 10A, 10B and 10C are diagrams showing the sectional structure of a PNP transistor, a method for connecting the transistor to a diode, a Veco measuring circuit, and results of measurements carried out by the Veco measuring circuit according to a fifth embodiment.

Next, a fourth embodiment will be described with reference to FIGS. 9, 10A, 10B and 10C. FIG. 9 shows the sectional structure of a vertical PNP transistor constituting a semiconductor output circuit, and a connection method for a protective diode. The sectional structure of the vertical NPN transistor is similar to that described above with reference to FIG. 2B. Thus, the same components carry the same reference numerals and description thereof is omitted.

As shown in FIG. 9, a PN junction device consisting a protective diode is connected to a vertical PNP transistor in the same direction as a base-collector PN junction of the transistor. That is, an anode of a protective diode 39 (a P side of the PN junction diode) is connected to a P type base region of the vertical PNP transistor, while a cathode of the protective diode 39 (an N side of the PN junction diode) is connected to an N type base region 21 of the vertical PNP transistor.

Figure 10A:
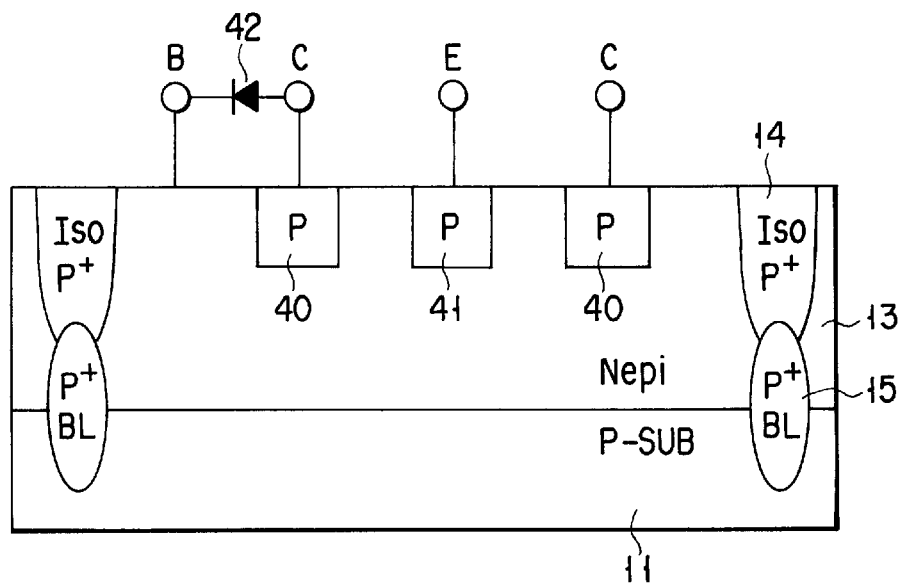

FIG. 10A shows the sectional structure of a lateral PNP transistor and a connection method for a protective diode. The sectional structure of the lateral PNP transistor is comprised of a P type emitter region 41 in a central portion of a device formation area and a P type collector region 40 formed to surround the P type emitter region 41. A base region consists of an N type epitaxial layer 13 between the P type emitter region 41 and the P type collector region 40 so that a transistor current flows in a lateral direction along a surface of the N type epitaxial layer 13 formed on a semiconductor substrate 11 such as silicon. The device isolation structure is similar to that described above for the vertical transistor, and detailed description thereof is omitted.

As shown in FIG. 10A, a PN junction device 42 consisting a protective diode is connected to a lateral PNP transistor in the same direction as a base-collector PN junction of the transistor. That is, an anode of a protective diode 42 (a P side of the PN junction diode) is connected to a P type collector region 40 of the lateral PNP transistor, while a cathode of the protective diode 42 (an N side of the PN junction diode) is connected to an N type base region 13 of the lateral PNP transistor.

Figure 10B:
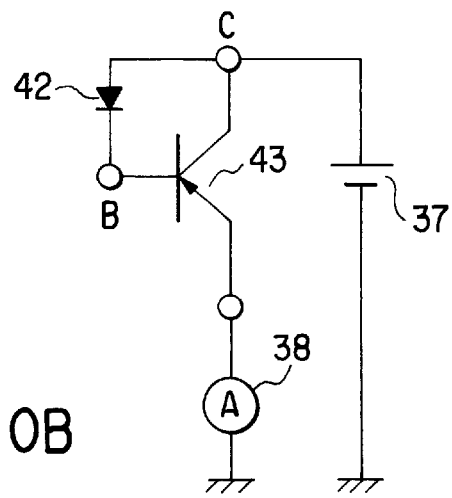

FIG. 10B shows a withstand voltage measuring circuit connected to the lateral PNP transistor 43 with the protective diode 42 in FIG. 9 to measure the withstand voltage during a reverse operation. The protective diode 42 is connected between a base and a collector of the lateral PNP transistor 43. The same reverse-operation withstand voltage measuring circuit in FIG. 10B can be used for the vertical PNP transistor in FIG. 9.

Figure 10C:
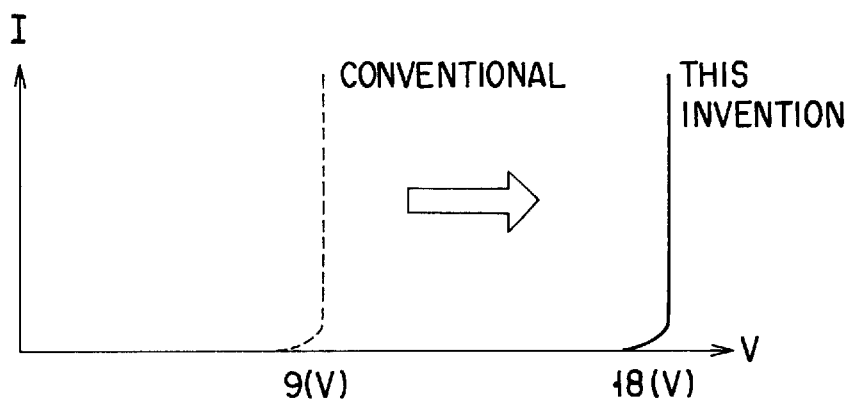

FIG. 10C shows, with solid lines, results of measurements for the reversely connected lateral PNP transistor with the protective diode 42, while showing, with broken lines, results of measurements for the absence of the protective diode according to the prior art. Results substantially similar to those described above for the vertical NPN transistor are obtained for the vertical PNP transistor.

As seen from the figures, by connecting the protective diode 42 between the base and collector of the lateral PNP transistor 43, the withstand voltage of the lateral PNP transistor during a reverse operation can be raised from 9 to 18V.

As shown in the third and fourth embodiments, the bipolar transistor operating in the reverse direction can be prevented from being broken down by connecting the protective diode between the base and collector of the bipolar transistor, connecting the anode of the protective diode to the P type side of the PN junction between the base and collector of the transistor, and connecting the cathode of the protective diode to the N type side of the PN junction.

Next, a fifth embodiment will be described with reference to FIGS. 11A, 11B, 12A and 12B. In the fifth embodiment, a variation of the rotective diodes described in the third and fourth embodiments is explained.

The third and fourth embodiments have been described in conjunction with the case where the PN junction device is connected between the base and collector of the bipolar transistor including a reverse operation, as a protective diode for the transistor, wherein the PN junction device has the same junction direction as the PN junction of the base and collector of the bipolar transistor.

The protective diode for protection against reverse operations, however, is not necessarily limited to two-terminal diodes. A three-terminal bipolar transistor may be operated as a two-terminal device by diode-connecting it as shown in FIGS. 11A, 11B, 12A and 12B.

Figure 11A:
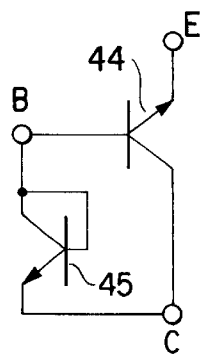
FIGS. 11A, 11B, 12A and 12B are diagrams showing a circuit configuration for PN junction devices according to a fifth embodiment.

As shown in FIG. 11A, a diode-connected NPN transistor 45 that is shorted between its base and collector can be used as a protective circuit for the NPN transistor 44 operating in the reverse direction. In this case, an emitter junction of the diode-connected NPN transistor operates as the protective diode. In FIG. 11A, the direction of the emitter junction is the same as that of the PN junction between the base and collector of the NPN transistor 44.

Figure 11B:
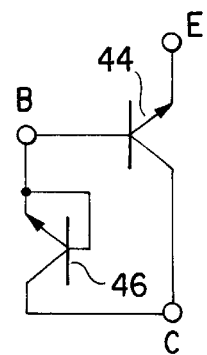

In FIG. 11B, a diode-connected NPN transistor 46 that is shorted between its base and emitter is used as a protective circuit for the NPN transistor 44 operating in the reverse direction. As shown in FIG. 11B, the direction of a collector junction of the diode-connected NPN transistor 46 is the same as that of the PN junction between the base and collector of the NPN transistor 44.

Figure 12A:
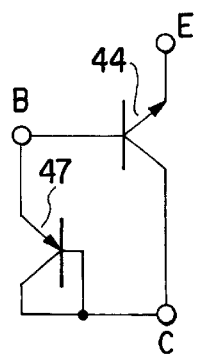

In FIG. 12A, a diode-connected PNP transistor 47 that is shorted between its base and collector is used as a protective circuit for the NPN transistor 44 operating in the reverse direction. As shown in FIG. 12A, the direction of an emitter junction of the diode-connected PNP transistor 47 is the same as that of the PN junction between the base and collector of the NPN transistor 44.

Figure 12B:
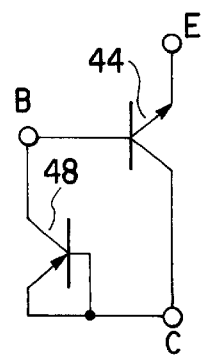

In FIG. 12B, a diode-connected PNP transistor 48 that is shorted between its base and emitter is used as a protective circuit for the NPN transistor 44 operating in the reverse direction. As shown in FIG. 12B, the direction of a collector junction of the diode-connected PNP transistor 48 is the same as that of the PN junction between the base and collector of the NPN transistor 44.

FIGS. 11A, 11B, 12A and 12B have been described in conjunction with the use of the diode-connected bipolar transistor as the protective circuit for the NPN transistor operating in the reverse direction. Of course, however, the diode-connected bipolar transistor is used as the protective circuit for the PNP transistor operating in the reverse direction.

In addition, the protective diode is not necessarily limited to the PN junction device consisting of the same semiconductor material as the bipolar transistor operating in the reverse direction. For example, the PN junction elements may consist of a semiconductor material different from that of the ark bipolar transistor operating in the reverse direction. In addition, the protective diode may be a Schottky type diode.

In this case, connections of the protective diode consisting of a Schottky type contact are achieved by connecting an anode of the diode to a P type side of the PN junction between the base and collector of the corresponding one of the transistors Q1, Q2 while connecting a cathode of this protective diode to an N type side of the PN junction between the base and collector of this transistor Q1, Q2.

Each of the embodiments described above is effective in increasing the emitter-collector withstand voltage Veco of the bipolar transistor operating in the reverse direction, without the needs for deep base-emitter diffusion of low impurity concentration. This can be implemented using a miniaturized process including shallow base-emitter diffusion of high impurity concentration and without the use of a special process that hinders miniaturization for the purpose of preventing breakdown of a semiconductor output circuit including an operation involving the reversal of the emitter and collector of the bipolar transistor. As a result, the chip size can be reduced.

In addition, according to the third and fifth embodiment, during a reverse bias state where the potentials of the collector and emitter of the NPN transistor are revered, a leakage current from the emitter-base junction of the NPN transistor, which is originally conveyed to the interior of the base of the NPN transistor, is diverted to the protective diode. Consequently, the amount of emitter-base junction leakage current transported to the interior of the base of the NPN transistor is diminished to restrain the NPN transistor itself from amplifying avalanche breakdown, thereby increasing the reverse withstand voltage Veco of the NPN transistor.

Furthermore, as described in the fourth embodiment, if the PNP transistor operates in the reverse direction, then during the reverse bias state where the potentials of the collector and emitter of the PNP transistor are revered, a leakage current from the emitter-base junction of the PNP transistor, which is originally extracted from the base of the PNP transistor, is supplied through the protective diode. Consequently, the amount of emitter-base junction leakage current extracted from the interior of the base of the PNP transistor is diminished to restrain the PNP transistor itself from amplifying avalanche breakdown, thereby increasing the reverse withstand voltage Vceo of the PNP transistor.

In either of the above cases, while the collector-emitter voltage of the bipolar transistor is biased in the forward direction, the protective diode connected between the collector and the base is not conductive, thereby precluding the normal operation of the bipolar transistor from being affected.

Figure 13:
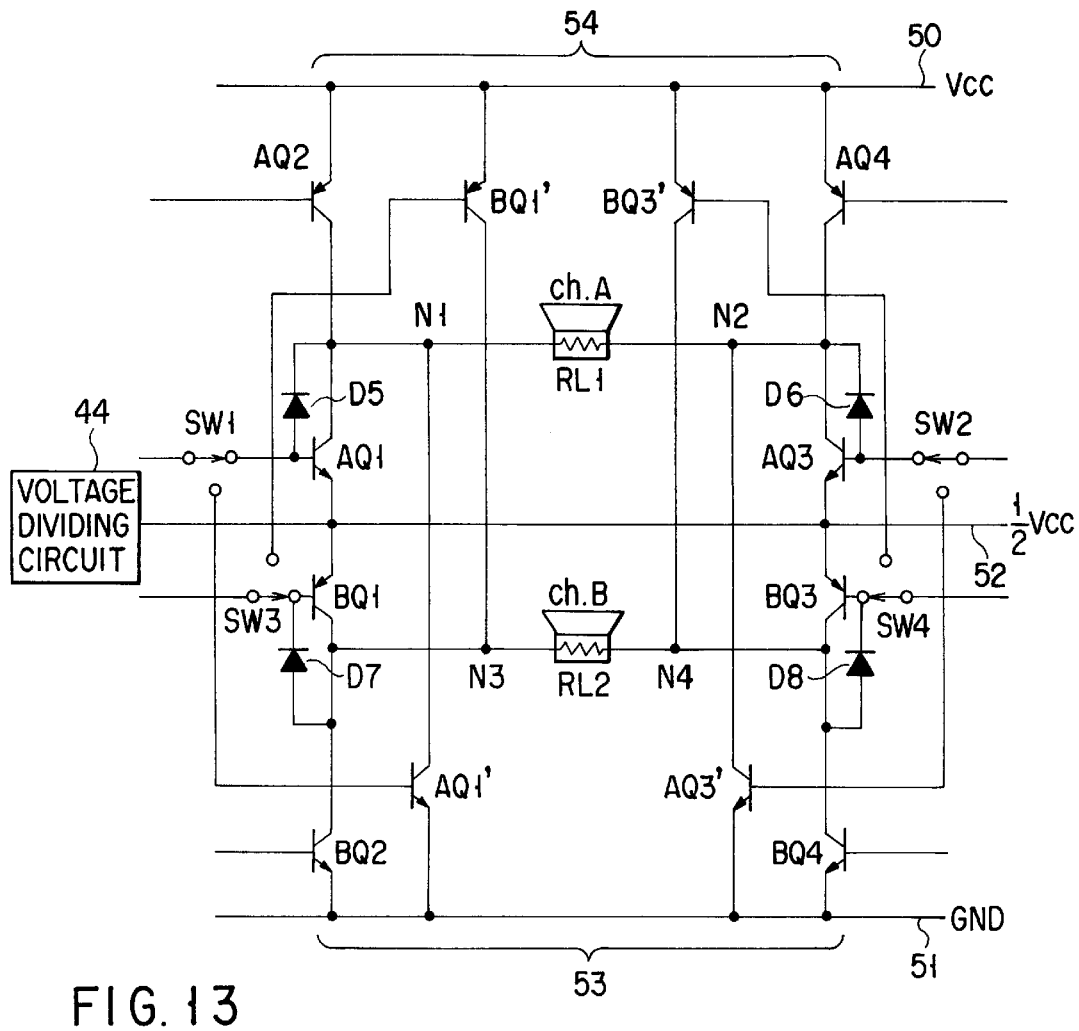
FIG. 13 is a diagram showing a circuit configuration of a push-pull amplifier IC according to a sixth embodiment.

Next, a sixth embodiment will be described with reference to FIG. 13. In the sixth embodiment, an applied example of the third and fourth embodiments is explained. FIG. 13 shows a circuit configuration of a car audio amplifier that efficiently amplifies audio signals to implement an amplifier system that generates less heat.

This amplifier comprises BTL (Bridge Tied Load) amplifiers each having an output bridge circuit with output transistors wherein the output transistors are bridge-connected together. A first BTL amplifier 53 is assigned a B channel (ch.B), whereas a second BTL amplifier 54 is assigned an A channel (ch.A). The BTL amplifiers 53, 54 are switched in such a manner that the output bridge circuits are vertically stacked between power source rails 50, 51 and that each output bridge circuit is independently connected between the power source rails 50, 51.

In addition, a first power source line (Vcc line) 50 is provided with a power source potential, while a second power source line (ground line) is provided with a ground potential GND, and these power source lines form the power source rails. An intermediate power source line 52 is provided between the power source rails 50, 51 and is provided with a divided potential, for example, Vcc/2 that is generated by dividing a power source voltage between the power source rails 50 and 51. The first BTL amplifier 53 is provided between the intermediate power source line 52 and the power source line 51, whereas the second BTL amplifier 54 is provided between the first power source line 50 and the intermediate power source line 52.

These amplifiers are semiconductor output circuits wherein a reverse potential may be applied between an emitter and a collector of an output transistor AQ1, AQ3, BQ1, BQ3.

Next, the second BTL amplifier with the ch.A is focused on to describe its operation in brief. The second BTL amplifier 54 is configured as a bridge circuit including a push-pull circuit consisting of the output transistors AQ1, AQ2 connected between the first power source line 50 and the intermediate power source line 52, and a push-pull circuit consisting of the output transistors AQ3, AQ4. A load RL1 on the ch.A is connected between output nodes N1, N2 of these push-pull circuits.

During a small-signal operation, the output nodes N1, N2 operate differentially between the power source voltage Vcc and the divided voltage Vcc/2, so that a forward voltage between 0 and the Vcc/2 is applied between the collector and emitter of the power output transistor AQ1, AQ3. No reverse potential is applied between the collector and emitter of the transistor.

However, in the amplifier shown in FIG. 13, during a large-signal operation, switching circuits SW1, SW2 are switched to switch the push-pull circuit consisting of the AQ1, AQ2 to a push-pull circuit consisting of AQ1', AQ2, while switching the push-pull circuit consisting of the AQ3, AQ4 to a push-pull circuit consisting of AQ3', AQ4.

This switching operation allows the output nodes N1, N2 of the second BTL amplifier 54 with the ch.A to maximally differentially drive the load RL1 between the Vcc line and the GND line, thereby accommodating a large signal output.

After the switching, the emitter of the output transistor AQ1, AQ3 is connected to the intermediate power source line 52, to which the divided potential Vcc/2 is provided. Then, the nodes N1, N2 are swung down to the ground, so that the reverse Vcc/2 is applied between the emitter and the collector. In addition, after the switching, a base of the output transistor AQ1, AQ3 is opened, and the output transistor AQ1, AQ3 may thus be broken down with a very low voltage such as Vceo as described above with reference to FIGS. 2A, 2B, 3A, and 3B.

In the amplifier shown in FIG. 13, since the ch.A and the ch.B are vertically and symmetrically arranged with the intermediate power source line at the voltage Vcc/2 located therebetween, a similar problem occurs with the output transistors BQ1, BQ3.

That is, if the output transistor BQ1, BQ3 with the ch.B is switched to BQ1', BQ3', respectively, and the potential of the node N3, N4 is swung up to the Vcc, since the emitter of the output transistor BQ1, BQ3 is connected to the intermediate power source line 52, to which the divided potential Vcc/2 is provided, the reverse potential Vcc/2 is applied between the emitter and collector of the output transistor BQ1, BQ3, which may be broken down with a low voltage such as Vceo.

As described above in the third and fourth embodiments, if protective diodes D5, D6, D7, D8 each consisting of a PN junction are each connected between a base and a collector of a corresponding one of the output transistors AQ1, AQ3, BQ1, BQ3 in parallel and in the same junction direction as the base-collector PN junction of the output transistor, the reverse withstand voltage of these output transistors, that is, the emitter-collector withstand voltage Vceo can be increased.

Next, a seventh embodiment will be described with reference to FIGS. 14A, 143, 14C and 14D. As described above in the sixth embodiment, the car audio amplifier shown in FIG. 13 has a reverse potential applied between the emitter and collector of each of the output transistors AQ1, AQ3, BQ1, BQ3 and additionally has the protective diode D5, D6, D7, D8 between the base and collector of a corresponding one of these output transistors to prevent their breakdown.

In FIG. 13, the circuit consisting of output transistors and to which the present invention is directed is not limited to the push-pull circuit but is essentially configured as shown in FIGS. 14A, 14B, 14C and 14D. In order to clarify the correspondence between FIG. 13 and FIGS. 14A and 14B, those components in FIGS. 14A and 14B that correspond to FIG. 13 have the same reference numerals.

Figures 14A, 14B:
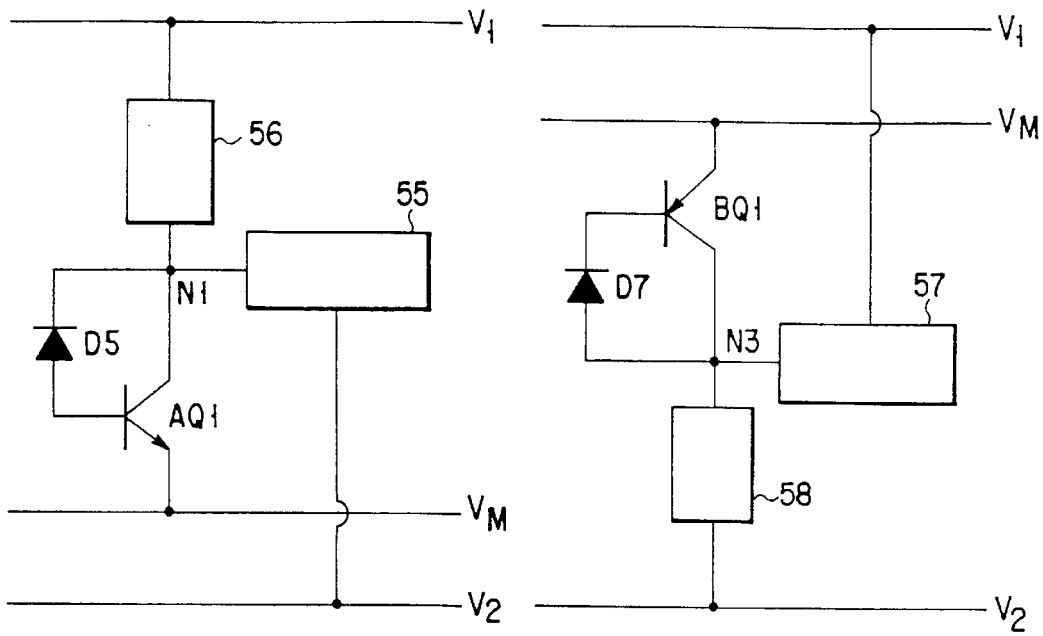
FIGS. 14A, 14B, 14C and 14D are diagrams showing circuit configurations for output transistors according to a seventh embodiment.

The Power source lines of the circuit shown in FIG. 14A consist of a first power source line at a voltage $V_1$, a second power source line at a voltage $V_2$ ($V_1 > V_2$), and an intermediate power source line at a voltage $V_M$ ($V_1 > V_M > V_2$). The collector of the NPN transistor AQ1 is connected to the first power source line via a load circuit 56.

In addition, one of the terminals of a circuit 55 comprised of an active element or an impedance element is connected to a power output node N1 constituting a connection point between the AQ1 and the load circuit.

As described above for the audio amplifier in FIG. 13, when the active element operates in the circuit shown in FIG. 14A, the potential of the output node N1 may decrease below $V_M$ because the emitter of the NPN transistor AQ1 is connected to the intermediate power source line at the voltage $V_M$ and because the other end of the circuit 55 comprised of the active element or the impedance element is connected to the second power source line at the voltage $V_2$ ($V_2 < V_M$).

A circuit operation in which the output node N1 has a potential lower than $V_M$ in the above manner is induced by a switching operation performed by the active element, or a counter electromotive force from the inductive load included in the impedance element, or a composite effect of these two factors.

In this case, since a reverse voltage is applied between the emitter and collector of the NPN transistor AQ1, a protective diode D5 is connected between the base and collector of the NPN transistor to prevent its breakdown.

FIG. 14B shows a circuit configuration in which a reverse voltage is applied between the emitter and collector of the PNP transistor BQ1. In the circuit configuration shown in FIG. 14B, the potential of the output node N3 may increase above $V_M$ because the emitter of the PNP transistor BQ1 is connected to the intermediate power source line at the voltage $V_M$ and because the other end of a circuit 57 comprised of an active element or an impedance element is connected to the first power source line at the voltage $V_1$ ($V_1 > V_M$).

Thus, since a reverse voltage is applied between the emitter and collector of the PNP transistor BQ1, the protective diode D7 is connected between the base and collector of the PNP transistor to prevent its breakdown.

Figures 14C, 14D:
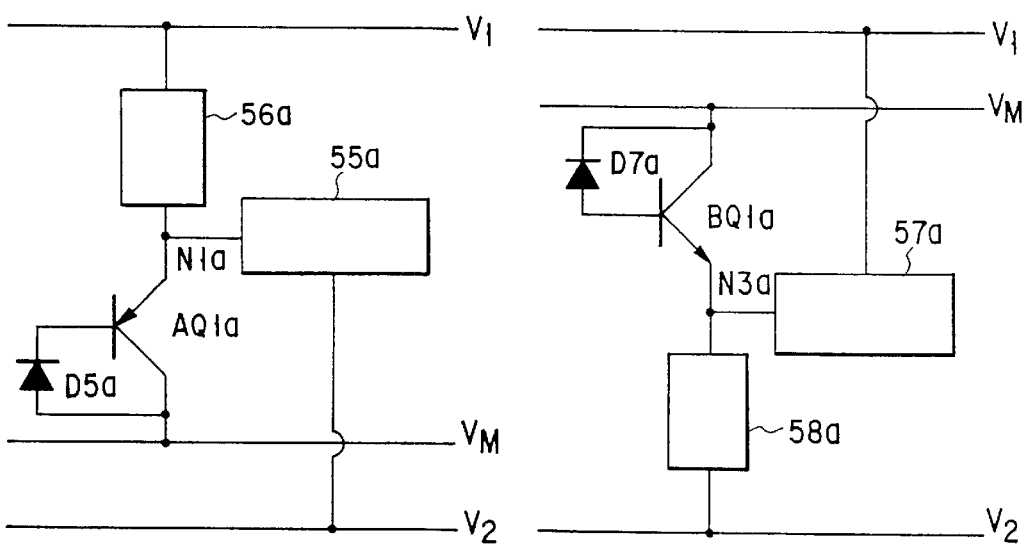

In the circuit shown in FIG. 14A, the transistor AQ1 is described as NPN type. The transistor AQ1 is, however, not limited to NPN type. As shown in FIG. 14C, when the transistor AQ1 is a PNP transistor AQ1a, the transistor AQ1a is protected from breakdown by connecting a protective diode D5a between the base-collector of the transistor AQ1a.

In this case, the load circuit 56 is replaced by 56a, the emitter of PNP transistor AQ1a and one of the terminals of the load circuit 56a are connected to form output node N1a, the circuit 55a comprised of an active element or an impedance element is connected between the output node N1a and the second power source line, the collector of the PNP transistor is connected to the intermediate line, the other terminal of the load circuit 56a is connected to the first power source line, the anode of the protective diode D5a is connected to the collector of the PNP transistor, and cathode of the protective diode D5a is connected to the base of the PNP transistor.

In the circuit shown in FIG. 14B, the transistor BQ1 is described as PNP type. The transistor BQ1 is, however, not limited to PNP type. As shown in FIG. 14D, when the transistor BQ1 is a NPN transistor BQ1a, the transistor BQ1a is protected from breakdown by connecting a protective diode D7a between the base-collector of the transistor BQ1a.

In this case, the load circuit 58 is replaced by 58a on the emitter side, the emitter of the NPN transistor BQ1a and one of the terminals of the load circuit 58a are connected to form output node N3a, the circuit 57a comprised of an active element or an impedance element is connected between the output node N3a and the first power source line, the collector of the PNP transistor is connected to the intermediate line, the other terminal of the load circuit 58a on the emitter side is connected to the second power source line, the anode of the protective diode D7a is connected to the base of the NPN transistor, and cathode of the protective diode D7a is connected to the collector of the NPN transistor.

In the sixth and seventh embodiments, Schottky diodes and diode-connected bipolar transistors described in the fifth embodiment are used as well in place of the PN junction diodes.

Figure 15A:
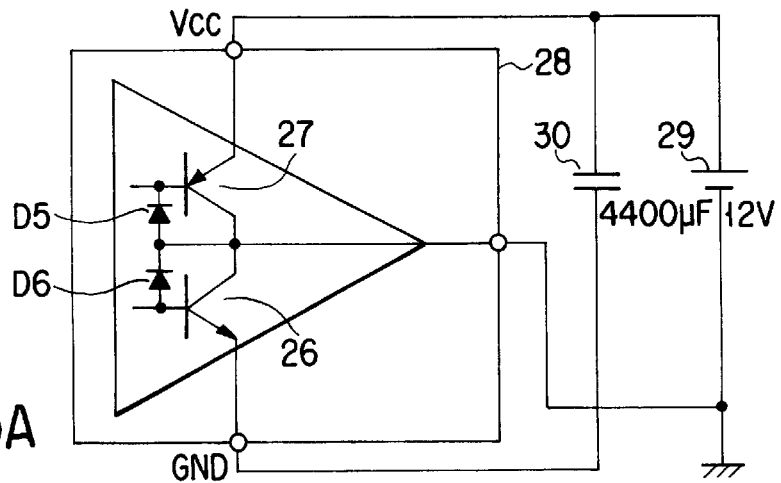
FIGS. 15A and 15B show diagrams showing circuit configurations for the ground open output-ground shorting test and Vcc open output-Vcc shorting test for an amplifier IC according to an eighth embodiment.
Figure 15B:
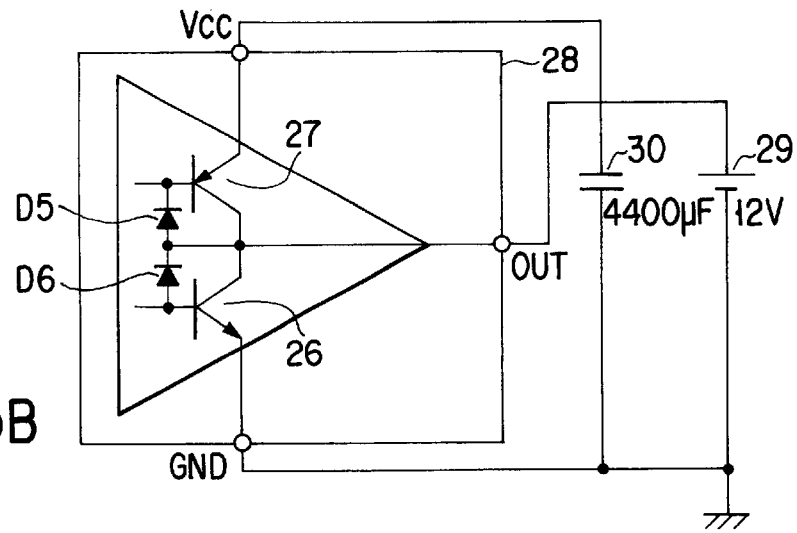

Next, an eighth embodiment will be described with reference to FIGS. 15A and 15B. The ground open output-ground shorting test and Vcc open output-Vcc shorting test have already been explained as effective means for preventing breakdown of a semiconductor output circuit caused by a user's inappropriate operation or the like.

Figure 4A:
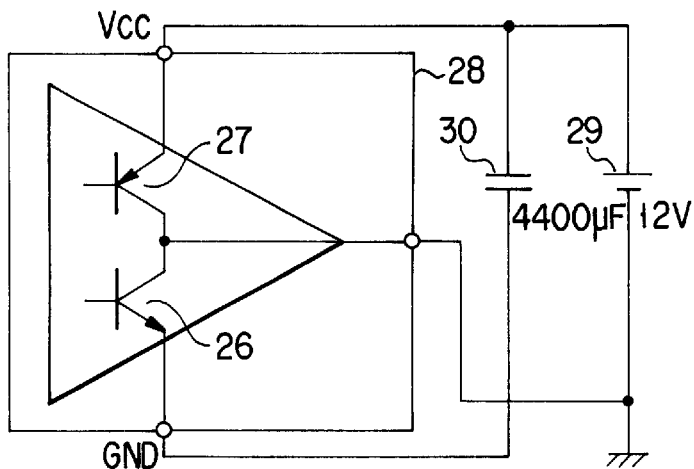
FIG. 4A is a diagram showing a circuit configuration for a ground open output-ground shorting test for an amplifier IC.
Figure 4B:
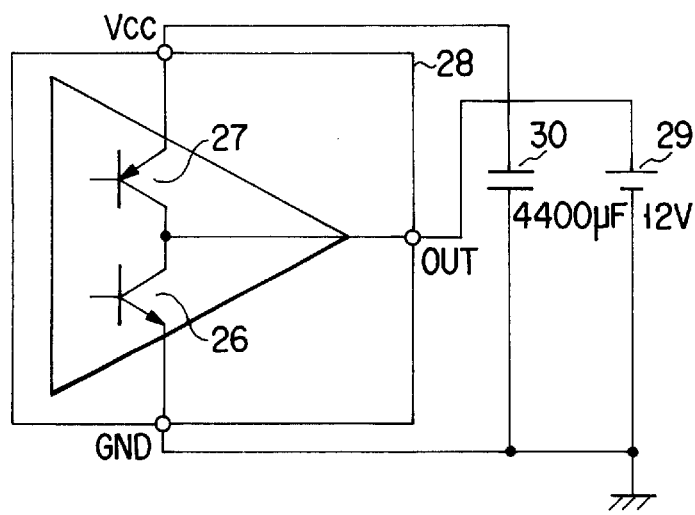
FIG. 4B is a diagram showing a configuration of a circuit for a Vcc open output-Vcc shorting test for an amplifier IC.

Since the implementation methods for the ground open output-ground shorting test and Vcc open output-Vcc shorting test shown in FIGS. 15A and 15B have already been described with reference to FIGS. 4A and 4B, those components in FIGS. 15A and 15B that are the same as in FIGS. 4A and 4B carry the same reference numerals and detailed description thereof is thus omitted.

In order to pass these tests, protective diodes D5, D6 each consisting of a PN junction may each be connected between a base and a collector of a corresponding one of output transistors 26, 27 in parallel and in the same direction as a base-collector PN junction of the output transistor. By shipping semiconductor output circuits 28 that have passed the ground open output-ground shorting test and the Vcc open output-Vcc shorting test, breakdown originating in a user's improper operation can be avoided.

Figure 16:
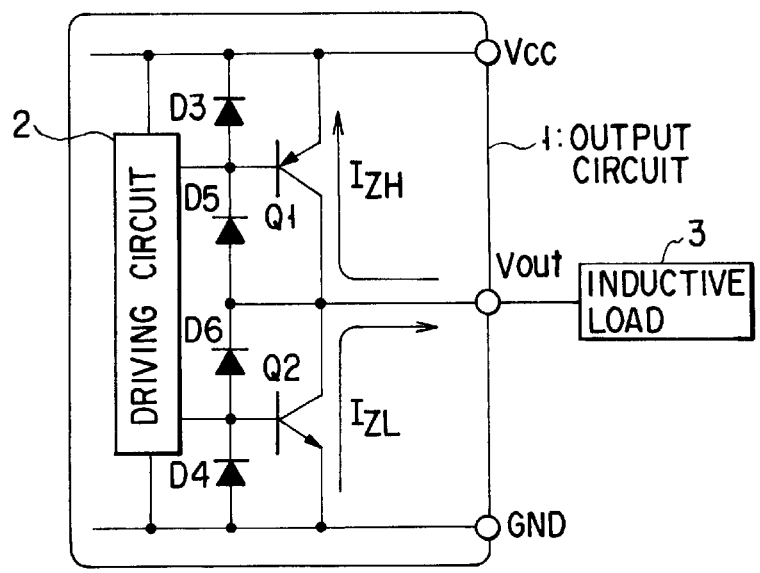
FIG. 16 is a diagram showing a push-pull semiconductor output circuit with an inductive load connected thereto according to a ninth embodiment of the present invention.

Next, a ninth embodiment of the present invention will be described with reference to FIG. 16. The first embodiment has already been explained in conjunction with the case where the PN junction devices are each connected, as a protective diode D3, D4 for protection against reverse operations, between the base and emitter of a corresponding one of the transistors Q1, Q2 consisting the push-pull semiconductor output circuit shown in FIG. 5, wherein the PN junction device has a junction direction reverse to that of the PN junction between the base and emitter of the transistor.

In this case, if the transistors Q1, Q2 have a reverse current gain $\beta_R$ larger than 1, they can be operated on the "ON" side to absorb a counter electromotive force from the inductive load so as to preclude the reverse voltage between the collector and emitter of the transistor from exceeding the Veco.

However, by further connecting each of the protective diodes D5, D6 for protection against reverse operations between the base and collector of a corresponding one of the transistors Q1, Q2 in such a manner that the junction direction of the diode is the same as that of the PN junction between the base and collector of the transistor, the value Veco can be increased to a higher level by the protective diodes D5, D6 during a reverse operation, as described in the fourth and fifth embodiments. Therefore, the protective diodes D5, D6, in combination with the protective diodes D3, D4, can provide a more perfect effect of protecting the semiconductor output circuit.

The present invention is not limited to the above embodiments. Although the above embodiments have been described in conjunction with the case where the semiconductor output circuit according to the present invention is principally formed on the silicon substrate, the present invention is not limited to the use of silicon.

The protective effect can further be improved based on the characteristic that when the PN junction for the protective diode is formed, for example, using Ge as a material, the resulting forward clamping voltage is smaller than in the silicon PN. In addition, the material of the semiconductor substrate and epitaxial semiconductor is not limited to silicon but may be a compound semiconductor such as GaAs.

In addition, in the description of the amplifier in the sixth embodiment, the potential of the intermediate power source line is the Vcc/2, but this potential need not necessarily be the Vcc/2. The present invention is applicable as long as the potential of the intermediate power source line is lower than the Vcc and higher than the ground. Various other variations can be implemented without deviating from the spirits of the present invention.

With the above configuration, the present invention can increase the emitter-collector withstand voltage Veco of the bipolar transistor without the needs for deep base-emitter diffusion of low impurity concentration. Thus, even if a semiconductor output circuit is formed using a miniaturized process involving shallow base-emitter diffusion of high impurity concentration and the potentials of an emitter and a collector of a bipolar transistor consisting the output circuit are reversed, the present invention can protect this semiconductor output circuit from breakdown. Therefore, the chip size of a semiconductor device including the semiconductor output circuit can be reduced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor output circuit comprising:
   a bipolar transistor;
   a load circuit of said bipolar transistor;
   a circuit comprised of an active element or an impedance element a terminal of said circuit being connected to a connecting portion of said bipolar transistor and said load circuit; and
   a protective diode configured to protect said bipolar transistor,
   wherein said circuit comprised of the active element or the impedance element causes a reverse operation of the bipolar transistor reversing a polarity of a difference in potential between a collector and an emitter thereof in comparison to a normal bias state, said protective diode protects said bipolar transistor from said reverse operation, and an anode of said protective diode is connected to a P type side of a base-collector PN junction of said bipolar transistor while a cathode of said protective diode is connected to an N type side of the base-collector PN junction of said bipolar transistor.

2. A semiconductor output circuit according to claim 1, wherein said protective diode comprises a PN junction, and a P type side of said protective diode is connected to the P type side of the base-collector PN junction of said bipolar transistor, while the N type side of said protective diode is connected to an N type side of the base-collector PN junction of said bipolar transistor.

3. A semiconductor output circuit according to claim 1, wherein said protective diode comprises a metal-semiconductor Schottky contact, and a metal side of said protective diode is connected to the P type side of the base-collector PN junction of said bipolar transistor, while a semiconductor side of said protective diode is connected to the N type side of the base-collector PN junction of said bipolar transistor.

4. A semiconductor output circuit according to claim 1, wherein said protective diode comprises a diode-connected PNP transistor that is shorted between its base and collector, and a P type side of a base-emitter PN junction of said diode-connected PNP transistor is connected to the P type side of the base-collector PN junction of said bipolar transistor, while an N type side of the base-emitter PN junction of said diode-connected PNP transistor is connected to the N type side of the base-collector PN junction of said bipolar transistor.

5. A semiconductor output circuit according to claim 1, said protective diode comprises a diode-connected NPN transistor that is shorted between its base and collector, and a P type side of a base-emitter PN junction of said diode-connected NPN transistor is connected to the P type side of the base-collector PN junction of said bipolar transistor, while an N type side of the base-emitter PN junction of said diode-connected NPN transistor is connected to the N type side of the base-collector PN junction of said bipolar transistor.

6. A semiconductor output circuit according to claim 1, wherein said protective diode comprises a diode-connected PNP transistor that is shorted between its base and emitter, and a P type side of a base-collector PN junction of said diode-connected PNP transistor is connected to the P type side of the base-collector PN junction of said bipolar transistor, while an N type side of the base-collector PN junction of said diode-connected PNP transistor is connected to the N type side of the base-collector PN junction of said bipolar transistor.

7. A semiconductor output circuit according to claim 1, wherein said protective diode comprises a diode-connected NPN transistor that is shorted between its base and emitter, and a P type side of a base-collector PN junction of said diode-connected NPN transistor is connected to the P type side of the base-collector PN junction of said bipolar transistor, while an N type side of the base-collector PN junction of said diode-connected NPN transistor is connected to the N type side of the base-collector PN junction of said bipolar transistor.

8. A semiconductor output circuit according to claim 1, wherein said protective diode protects said bipolar transistor during a ground open output-ground shorting test if said bipolar transistor is a transistor connected between a ground terminal and an output terminal, while protecting said bipolar transistor during a Vcc open output-Vcc shorting test if said bipolar transistor is a transistor connected between a Vcc terminal and the output terminal.

9. A semiconductor output circuit comprising:
   a first power source line;
   a second power source line having a lower voltage than said first power source line;
   an intermediate power source line having a voltage lower than that of said first power source line and higher than that of said second power source line;
   an output node of an NPN transistor to which a collector of said NPN transistor and one of the terminals of a load circuit are connected;
   a circuit comprised of an active element or an impedance element having one of its terminals connected to said output node,
   a protective diode configured to protect said NPN transistor,
   wherein said circuit comprised of the active element or the impedance element causes a reverse operation of said NPN transistor reversing a polarity of a difference in potential between a collector and an emitter thereof in comparison to a normal bias state, and said protective diode protects said NPN transistor from said reverse operation, and wherein an emitter of said NPN transistor is connected to said intermediate power source line, the other terminal of said load circuit is connected to said first power source line, the other terminal of said circuit comprised of the active element or the impedance element is connected to said second power source line, a cathode of said protective diode is connected to the collector of said NPN transistor, and an anode of said protective diode is connected to a base of said NPN transistor.

10. A semiconductor output circuit comprising:

a first power source line;

a second power source line having a lower voltage than said first power source line;

an intermediate power source line having a voltage lower than that of said first power source line and higher than that of said second power source line;

an output node of an PNP transistor to which a collector of said PNP transistor and one of the terminals of a load circuit are connected;

an a circuit comprised of an active element or an impedance element having one of its terminals connected to said output node, and a protective diode configured to protect said PNP transistor, wherein said circuit comprised of the active element or the impedance element causes a reverse operation of said PNP transistor reversing a polarity of a difference in potential between a collector and an emitter thereof in comparison to a normal bias state, and said protective diode protects said PNP transistor from said reverse operation, and wherein an emitter of said PNP transistor is connected to said intermediate power source line, the other terminal of said load circuit is connected to said second power source line, the other terminal of said circuit comprised of the active element or the impedance element is connected to said first power source line, a cathode of said protective diode is connected to a base of said PNP transistor, and an anode of said protective diode is connected to the collector of said PNP transistor.

* * * * *